(12) United States Patent
Ishikawa

(10) Patent No.: US 9,899,278 B2
(45) Date of Patent: Feb. 20, 2018

(54) SEMICONDUCTOR MANUFACTURING APPARATUS AND SEMICONDUCTOR MANUFACTURING METHOD

(71) Applicant: Toshiba Memory Corporation, Minato-ku (JP)

(72) Inventor: Masao Ishikawa, Neyagawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 136 days.

(21) Appl. No.: 14/793,047

(22) Filed: Jul. 7, 2015

(65) Prior Publication Data

US 2016/0233135 A1 Aug. 11, 2016

(30) Foreign Application Priority Data

Feb. 6, 2015 (JP) .................................. 2015-022096

(51) Int. Cl.
| | |
|---|---|
| *H01B 13/00* | (2006.01) |
| *H01L 21/66* | (2006.01) |
| *H01L 21/306* | (2006.01) |
| *H01L 21/308* | (2006.01) |
| *H01J 37/32* | (2006.01) |

(52) U.S. Cl.
CPC ........ *H01L 22/26* (2013.01); *H01J 37/32963* (2013.01); *H01J 37/32972* (2013.01); *H01L 21/308* (2013.01); *H01L 21/30604* (2013.01)

(58) Field of Classification Search
CPC .......... H01J 37/32972; H01J 37/32963; H01L 21/30604; H01L 21/308; H01L 22/26
USPC ................................................ 216/59, 60, 13
See application file for complete search history.

(56) References Cited

U.S. PATENT DOCUMENTS

| | | | | |
|---|---|---|---|---|
| 2006/0006139 | A1* | 1/2006 | Johnson .............. | B81C 1/00579 216/60 |
| 2014/0116621 | A1* | 5/2014 | Mori .......................... | C23F 4/00 156/345.26 |
| 2016/0111261 | A1* | 4/2016 | Kabouzi ........... | H01J 37/32963 438/10 |

FOREIGN PATENT DOCUMENTS

| | | |
|---|---|---|
| JP | 2001-044171 | 2/2001 |
| JP | 2014-072269 | 4/2014 |
| JP | 2014-150149 | 8/2014 |

* cited by examiner

*Primary Examiner* — Binh X Tran
(74) *Attorney, Agent, or Firm* — Oblon, McClelland, Maier & Neustadt, L.L.P.

(57) ABSTRACT

In one embodiment, a semiconductor manufacturing apparatus includes an extraction module configured to extract, in cycle etching that repeats first processes of etching a workpiece layer and second processes of performing different processing from the first processes for plural cycles, light emission intensities in the first processes for individual cycles. The apparatus further includes a detection module configured to detect an etching end point of the workpiece layer in the cycle etching, based on the light emission intensities of the plural cycles.

8 Claims, 8 Drawing Sheets

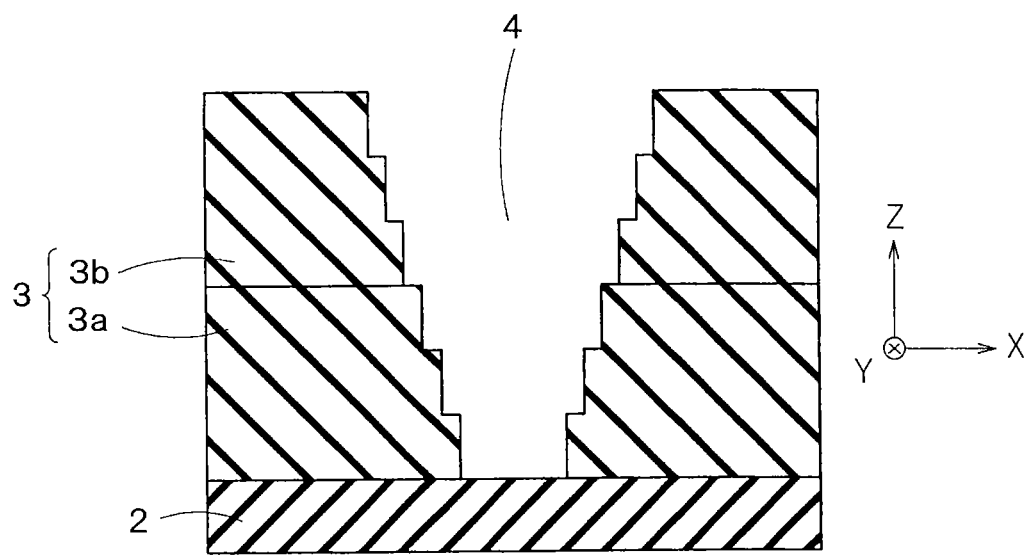
F I G. 4A
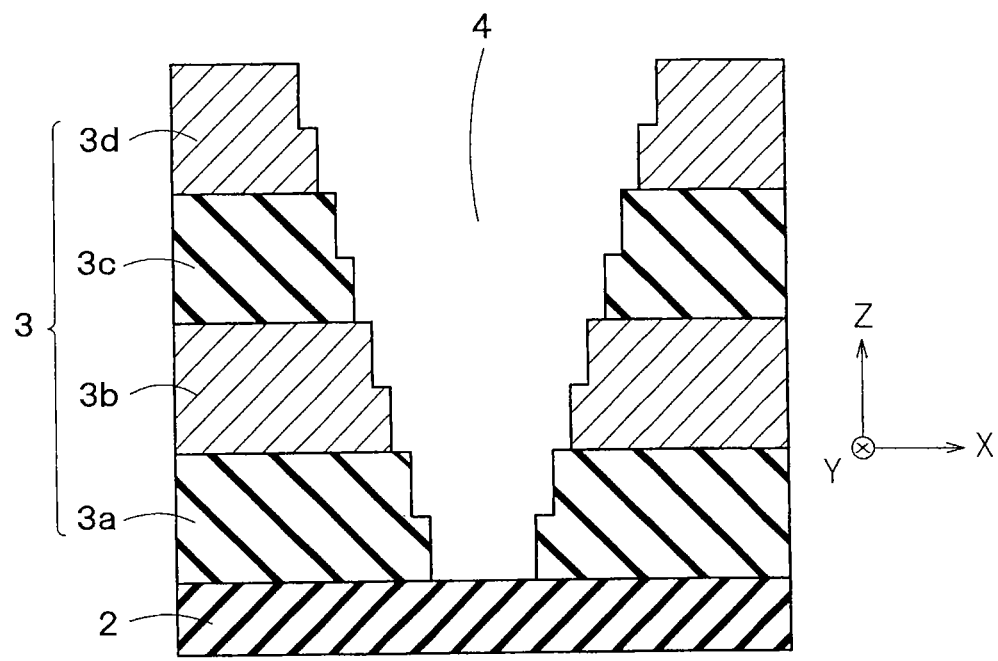
F I G. 4B

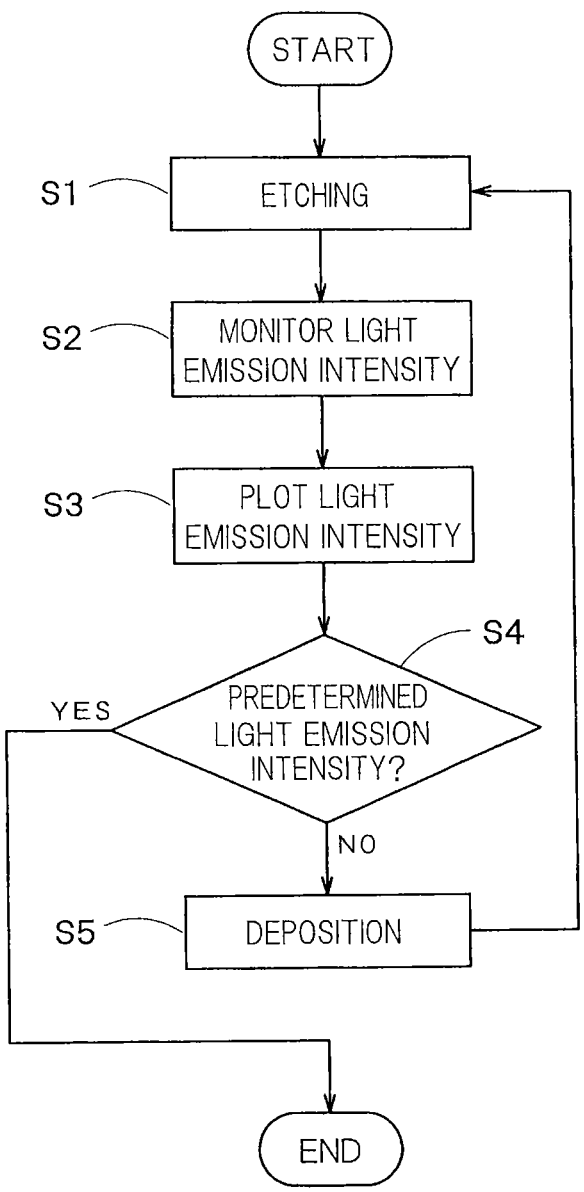
F I G. 9

SEMICONDUCTOR MANUFACTURING APPARATUS AND SEMICONDUCTOR MANUFACTURING METHOD

CROSS REFERENCE TO RELATED APPLICATION

This application is based upon and claims the benefit of priority from the prior Japanese Patent Application No. 2015-22096, filed on Feb. 6, 2015, the entire contents of which are incorporated herein by reference.

FIELD

Embodiments described herein relate to a semiconductor manufacturing apparatus and a semiconductor manufacturing method.

BACKGROUND

Cycle etching is a technique that alternately repeats etching processes and other processes (e.g., deposition processes) for plural cycles to process a workpiece layer into a desired shape. For example, an etching process in the cycle etching is performed by atomic layer etching (ALE) that etches the workpiece layer for one atomic layer or for several atomic layers.

In typical etching, time for etching the workpiece layer is sufficiently secured. Therefore, in the typical etching, a change in light emission intensity with time during the etching can be easily sensed, and the etching end point can be easily detected based on the change in light emission intensity. On the other hand, in the cycle etching, the etching processes for individual cycles are typically performed in short time to cope with the size shrinkage of semiconductor devices. Therefore, it is difficult in the cycle etching to stably sense the change in light emission intensity with time during the cycle etching. Therefore, it is difficult to detect the etching end point of the cycle etching based on the change in light emission intensity.

BRIEF DESCRIPTION OF THE DRAWINGS

FIGS. 4A and 4B are cross-sectional views illustrating a method of manufacturing a semiconductor device of modifications of the first embodiment;

FIG. 9 is a flowchart illustrating the semiconductor manufacturing method of the first embodiment.

DETAILED DESCRIPTION

Embodiments will now be explained with reference to the accompanying drawings.

In one embodiment, a semiconductor manufacturing apparatus includes an extraction module configured to extract, in cycle etching that repeats first processes of etching a workpiece layer and second processes of performing different processing from the first processes for plural cycles, light emission intensities in the first processes for individual cycles. The apparatus further includes a detection module configured to detect an etching end point of the workpiece layer in the cycle etching, based on the light emission intensities of the plural cycles.

(First Embodiment)

Figure 1:
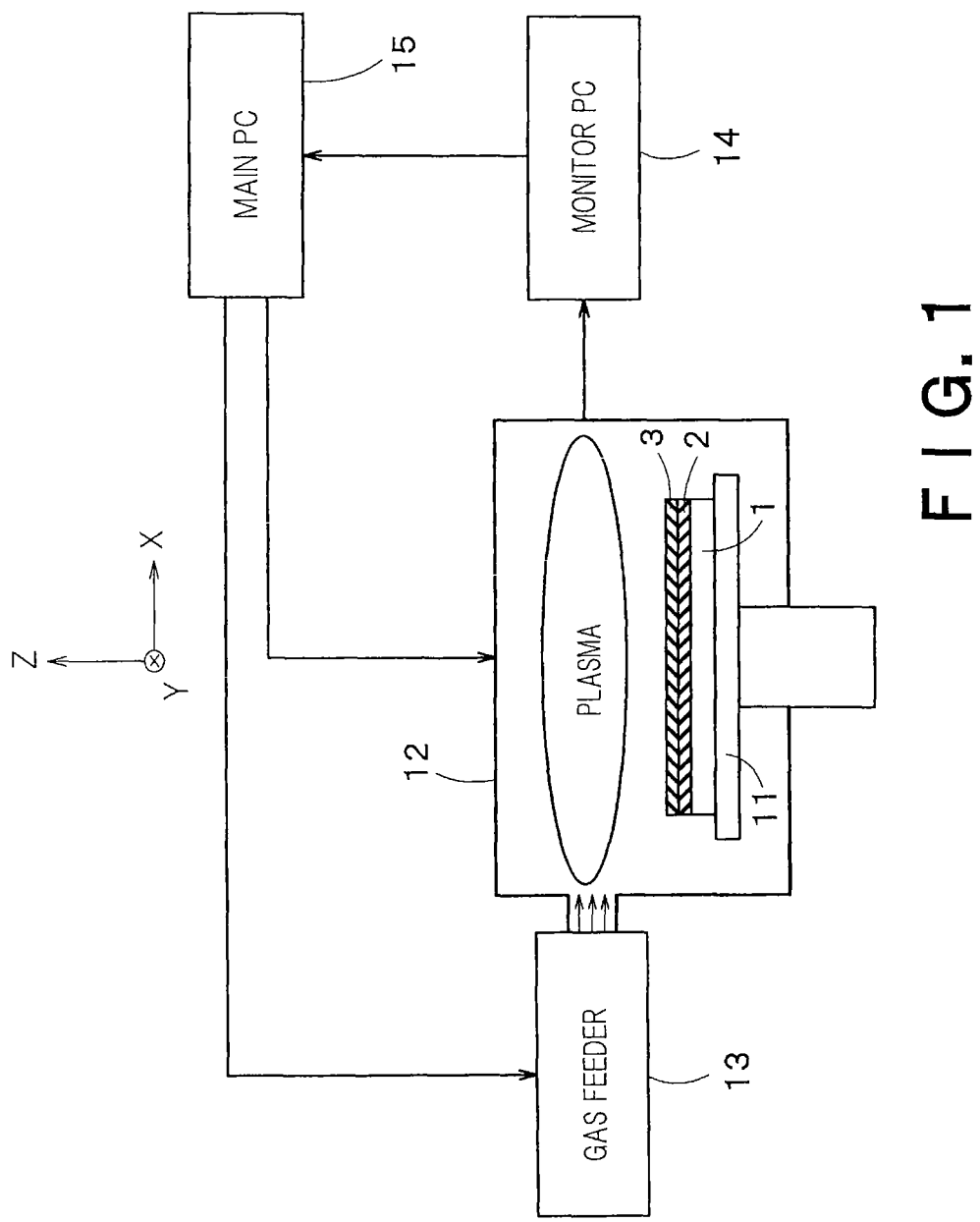
FIG. 1 is a schematic diagram illustrating a configuration of a semiconductor manufacturing apparatus of a first embodiment.

FIG. 1 is a schematic diagram illustrating a configuration of a semiconductor manufacturing apparatus of a first embodiment. The semiconductor manufacturing apparatus in FIG. 1 is used for cycle etching.

The semiconductor manufacturing apparatus in FIG. 1 includes a stage 11, a chamber 12, a gas feeder 13, a monitor personal computer (PC) 14 as an example of an extraction module, and a main PC 15 as an example of a detection module and a displaying module.

[Stage 11]

The stage 11 is disposed in the chamber 12 and used for placing a wafer (substrate) 1 in the chamber 12. The stage 11 can move the wafer 1 in the vertical direction and rotate the wafer 1 in the horizontal plane. FIG. 1 illustrates the wafer 1 placed on the stage 11, a ground layer 2 formed on the wafer 1, and a workpiece layer 3 formed on the ground layer 2.

An example of the wafer 1 is a semiconductor substrate such as a silicon substrate. FIG. 1 illustrates an X-direction and a Y-direction which are parallel to the surface of the wafer 1 and perpendicular to each other, and a Z-direction perpendicular to the surface of the wafer 1. In the specification, the +Z-direction is regarded as an upward direction and the −Z-direction is regarded as a downward direction. For example, positional relation between the wafer 1 and the workpiece layer 3 is expressed that the wafer 1 is positioned below the workpiece layer 3. The −Z-direction of the present embodiment may coincide with the direction of gravity or may not coincide with the direction of gravity.

The workpiece layer 3 is a layer processed in the cycle etching. The workpiece layer 3 may be a single layer formed of single material or may be a stacked layer including plural layers.

The ground layer 2 is formed between the wafer 1 and the workpiece layer 3. The ground layer 2 may be a single layer formed of single material or may be a stacked layer including plural layers. An example of the ground layer 2 is an etching stopper for the etching of the workpiece layer 3. Another example of the ground layer 2 is a ground workpiece layer processed after the workpiece layer 3 is processed.

While the workpiece layer 3 of the present embodiment is formed on the wafer 1 via the ground layer 2, the workpiece layer 3 may be formed directly on the wafer 1. Moreover, the wafer 1 may be a workpiece layer in the present embodiment. For example, in a case where an isolation trenches are formed in the wafer 1 by the cycle etching, the wafer 1 becomes the workpiece layer.

[Chamber 12]

The chamber 12 is used for containing the wafer 1. The cycle etching of the present embodiment is performed in the chamber 12.

In the cycle etching of the present embodiment, etching processes of etching the workpiece layer 3, deposition processes of depositing a film such as a carbon film on the workpiece layer 3, and breakthrough processes of removing an unnecessary oxide film formed on the workpiece layer 3 are repeated for plural cycles to process the workpiece layer 3 into a desired shape. The etching processes are an example of first processes. The deposition processes and the breakthrough processes are examples of second processes of performing different processing from the first processes.

Details of the etching processes, the deposition processes and the breakthrough processes are mentioned later.

[Gas Feeder 13]

The gas feeder 13 feeds a gas into the chamber 12. The gas feeder 13 feeds, for example, a gas for the etching processes, a gas for the deposition processes and a gas for the breakthrough processes.

For example, the semiconductor manufacturing apparatus of the present embodiment feeds a gas into the chamber 12 from the gas feeder 13, generates plasma from the gas in the chamber 12, and performs the etching processes or the deposition processes with the plasma.

[Monitor PC 14]

In the cycle etching of the present embodiment, light is generated from chemical reactions in the etching processes, the deposition processes and the breakthrough processes. The monitor PC 14 is provided for monitoring a change in intensity of the light. The monitoring results by the monitor PC 14 are transmitted to the main PC 15.

In the present embodiment, the etching end point in the cycle etching is detected based on the light emission intensity in the etching processes. The reason is that the light emission intensity in the etching processes changes depending on an etching amount of the workpiece layer 3, and therefore can be used for detecting the etching end point. Accordingly, the monitor PC 14 extracts light emission intensities in the etching processes for individual cycles in the cycle etching and transmits the extracted light emission intensities to the main PC 15.

[Main PC 15]

The main PC 15 receives the light emission intensities of the plural cycles such as a light emission intensity in an etching process of the first cycle, a light emission intensity in an etching process of the second cycle, . . . , and a light emission intensity in an etching process of the Nth cycle from the monitor PC 14, where N is an integer of two or more.

The main PC 15 then detects the etching end point of the workpiece layer 3 in the cycle etching, based on the light emission intensities of the plural cycles. In the present embodiment, when the main PC 15 detects the etching end point, the cycle etching is finished.

[Method of Manufacturing Semiconductor Device of First Embodiment]

FIGS. 2A to 3D are cross-sectional views illustrating a method of manufacturing a semiconductor device of the first embodiment.

Figure 2A:
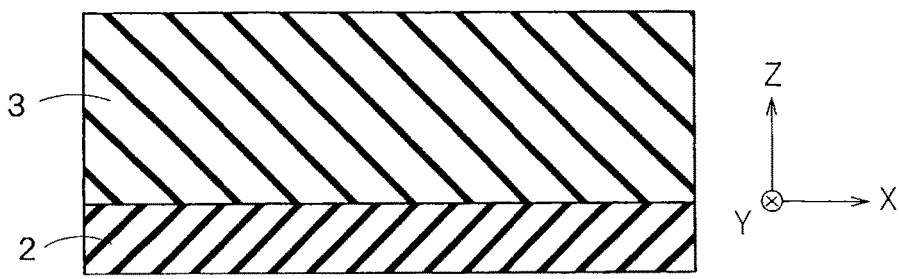
FIGS. 2A to 3D are cross-sectional views illustrating a method of manufacturing a semiconductor device of the first embodiment.

FIG. 2A illustrates the ground layer 2 and the workpiece layer 3 formed on the wafer 1 in FIG. 1. An example of the ground layer 2 is a silicon nitride film. An example of the workpiece layer 3 is a silicon oxide film. The workpiece layer 3 is processed by the cycle etching as follows.

Figure 2B:
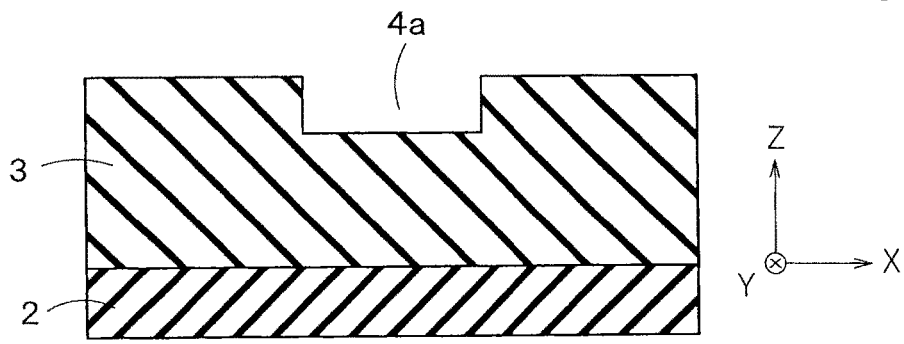

First, a concave portion 4a is formed in the workpiece layer 3 by ALE using an unshown resist film as a mask (FIG. 2B). This process is the etching process of the first cycle. The resist film is then removed.

Figure 2C:
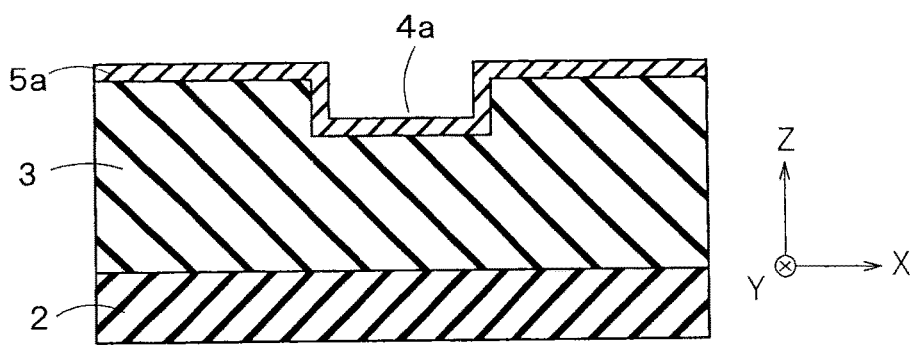

Next, a film 5a is deposited on the workpiece layer 3 by chemical vapor deposition (CVD) (FIG. 2C). As a result, the film 5a is formed on the side faces and the bottom face of the concave portion 4a. This process is the deposition process of the first cycle. An example of the film 5a is a carbon film. For example, the carbon film is formed by using a fluorocarbon gas and an oxygen gas.

The film 5a of the present embodiment includes the carbon film and an unnecessary oxide film formed on the surface of the carbon film. The oxide film is formed with the oxygen gas used in the deposition process. Therefore, in the present embodiment, the oxide film is removed after the deposition process. This process is the breakthrough process of the first cycle. The breakthrough process may be omitted if unnecessary.

Figure 2D:
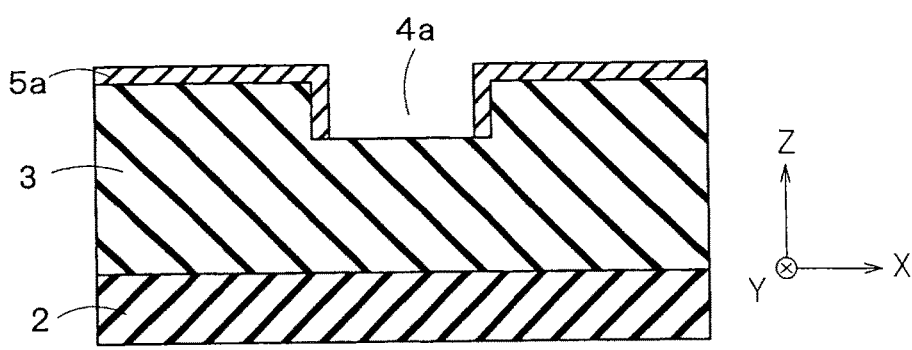

Next, the film 5a is removed from the bottom face of the concave portion 4a by etching (FIG. 2D). As a result, the workpiece layer 3 is exposed on the bottom face of the concave portion 4a.

Figure 3A:
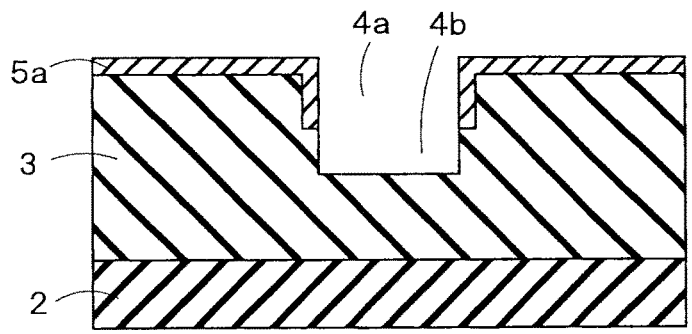
Figure 3A:
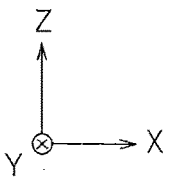

Next, the workpiece layer 3 on the bottom face of the concave portion 4a is etched by ALE using the film 5a as a mask (FIG. 3A). As a result, a concave portion 4b having a bottom face lower than that of the concave portion 4a is formed under the concave portion 4a. This process is the etching process of the second cycle. The film 5a is then removed.

Figure 3B:
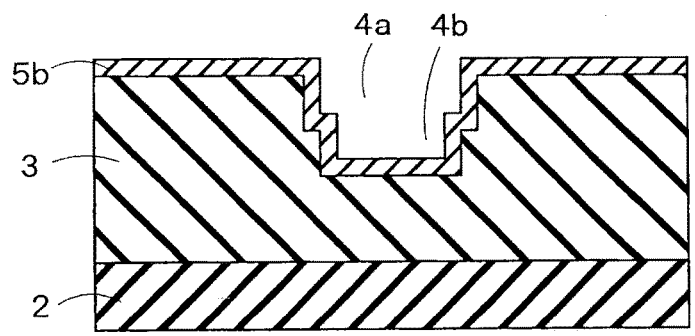
Figure 3B:
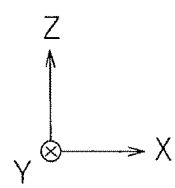

Next, a film 5b is deposited on the workpiece layer 3 by CVD (FIG. 3B). As a result, the film 5b is formed on the side faces and the bottom faces of the concave portions 4a and 4b. This process is the deposition process of the second cycle. An example of the film 5b is a carbon film, similarly to the film 5a. Next, the breakthrough process of the second cycle is performed.

Figure 3C:
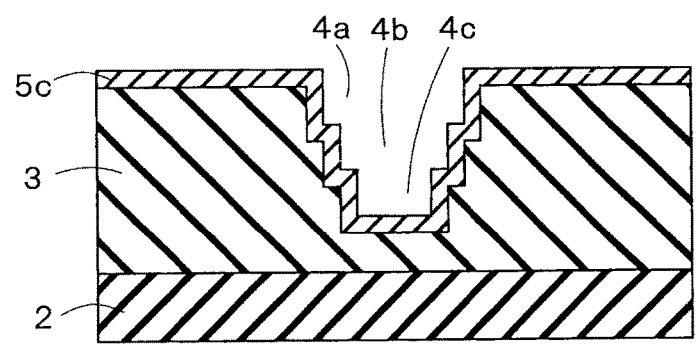
Figure 3C:
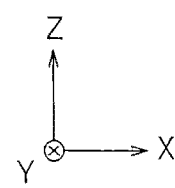

After that, the processes in FIGS. 2D, 3A and 3B are repeatedly performed in the present embodiment. FIG. 3C illustrates a concave portion 4c formed under the concave portion 4b, and a film 5c formed on the side faces and the bottom faces of the concave portions 4a to 4c. In this way, the bottom face of the concave portion of the workpiece layer 3 is gradually lowered. For example, an etching process of a Kth cycle lowers the bottom face of the concave portion that is formed in the workpiece layer 3 in etching processes of the first to (K−1)th cycles, where K is an integer of two or more).

Figure 3D:
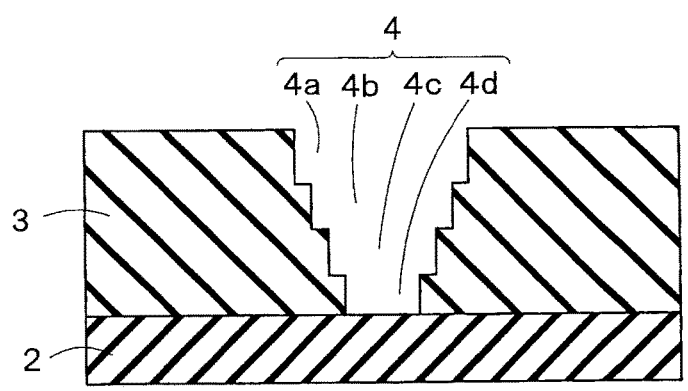
Figure 3D:
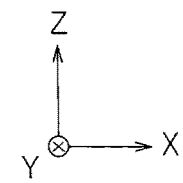

As a result, a hole 4 that penetrates the workpiece layer 3 is formed (FIG. 3D). FIG. 3D illustrates, as an example, the hole 4 that is formed of four concave portions 4a to 4d. The number of the concave portions 4a to 4d formed until the hole 4 penetrates the workpiece layer 3 may be other than four.

The etching end point of the present embodiment is the time point when the hole 4 that penetrates the workpiece layer 3 is formed. In the present embodiment, this etching end point is detected based on the light emission intensities in the etching processes for the individual cycles. Details of the method of detecting the etching end point are mentioned later.

FIGS. 4A and 4B are cross-sectional views illustrating a method of manufacturing a semiconductor device of modifications of the first embodiment.

The workpiece layer 3 in FIG. 4A is a stacked layer including a layer 3a and a layer 3b. The workpiece layer 3 in FIG. 4B is a stacked layer that alternately includes first layers 3a and 3c formed of a first material and second layers 3b and 3d formed of a second material. An example of the first layers 3a and 3c is insulators such as silicon oxide films and silicon nitride films. Examples of the second layers 3b and 3d are semiconductor layers such as polysilicon layers and metal layers such as tungsten layers. In this manner, the workpiece layer 3 of the present embodiment may be a stacked layer including plural layers.

[Semiconductor Manufacturing Method of First Embodiment]

FIGS. 5 to 8 are graphs for explaining a semiconductor manufacturing method of the first embodiment. The semiconductor manufacturing method of the present embodiment is performed by the semiconductor manufacturing apparatus in FIG. 1 to manufacture the semiconductor device illustrated in FIGS. 2A to 3D.

Figure 5:
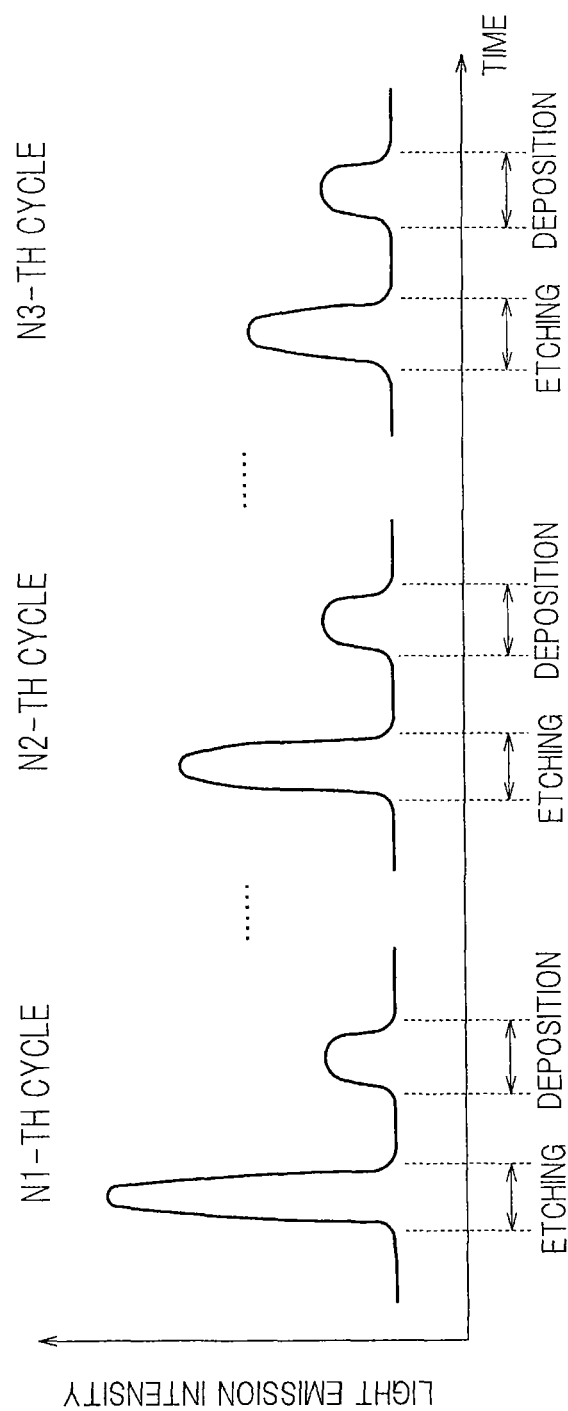
FIGS. 5 to 8 are graphs for explaining a semiconductor manufacturing method of the first embodiment.

The vertical axis in FIG. 5 represents the light emission intensities in the etching processes and the deposition processes of an N1-th cycle, an N2-th cycle and an N3-th cycle, where N1<N2<N3. The horizontal axis in FIG. 5 represents time.

Light in the etching processes of the present embodiment is generated as follows. First, the etching plasma and the workpiece layer 3 react on the bottom face of the concave portion to generate a reaction compound. Next, the reaction compound dissociates to generate plasma. Then, transition of this plasma from an excited state to a ground state generates the light. For example, in a case where the etching plasma is Cl (chlorine) plasma and the workpiece layer 3 is an Si (silicon) layer, $SiCl_2$ is generated as the reaction compound, and $SiCl_2$ dissociates into $Si^{2+}$ and $Cl^-$. Transition of $Si^{2+}$ and $Cl^-$ from their excited states to the ground states generates the light.

As illustrated in FIG. 5, the light emission intensities in the etching processes of the present embodiment decrease as the cycle etching proceeds. For example, the light emission intensity in the etching process of the N2-th cycle is lower than the light emission intensity in the etching process of the N1-th cycle. Moreover, the light emission intensity in the etching process of the N3-th cycle is lower than the light emission intensity in the etching process of the N2-th cycle.

The reason for the decrease of the light emission intensities as above is anticipated as follows. A part of the above-mentioned plasma that is generated from the reaction compound does not undergo transition from the excited state to the ground state, resulting in sticking again to the side faces and the bottom face of the concave portion. Such plasma does not generate light. A probability that the plasma sticks to the side faces and the bottom face of the concave portion becomes higher as the bottom face of the concave portion becomes deeper. It is anticipated that this is the reason that the light emission intensities in the etching processes of the present embodiment decrease more as the cycle etching further proceeds.

On the other hand, the light emission intensities in the deposition processes of the present embodiment do not decrease and are constant even as the cycle etching proceeds (FIG. 5). This is anticipated because the light in the deposition processes of the present embodiment is caused by the transition of the plasma of the reactant gas and is not affected by the depth of the bottom face of the concave portion. Also, the light emission intensities in the breakthrough processes of the present embodiment do not decrease and are constant even as the cycle etching proceeds.

In this manner, the light emission intensities in the etching processes of the present embodiment change as the cycle etching proceeds. Therefore, the light emission intensities in the etching processes can be used for detecting the etching end point. Therefore, the monitor PC 14 of the present embodiment extracts the light emission intensities in the etching processes for the individual cycles in the cycle etching, for detecting the etching end point. Specifically, the monitor PC 14 of the present embodiment extracts a light emission waveform in an etching process of each cycle and extracts the light emission intensity from the light emission waveform.

In the case where the etching plasma is Cl plasma and the workpiece layer 3 is an Si layer, the light in the etching processes contains light with a wavelength relevant to the transition of $Si^{2+}$ and light with a waveform relevant to the transition of $Cl^-$. In this case, the former light is not observed after the etching of the workpiece layer 3 is ended, while the latter light is observed even after the etching of the workpiece layer 3 is ended. Therefore, in extracting the light emission intensities in the etching processes, if only the light emission intensities in the wavelength region relevant to the transition of $Si^{2+}$ is extracted, the etching end point can be more accurately detected. The same holds true for cases other than the case where the workpiece layer 3 is an Si layer.

Therefore, when the monitor PC 14 of the present embodiment extracts the light emission intensities in the etching processes, the monitor PC 14 may extract only the light emission intensities in the wavelength region relevant to the transition of the atoms included in the workpiece layer 3.

Figure 6:
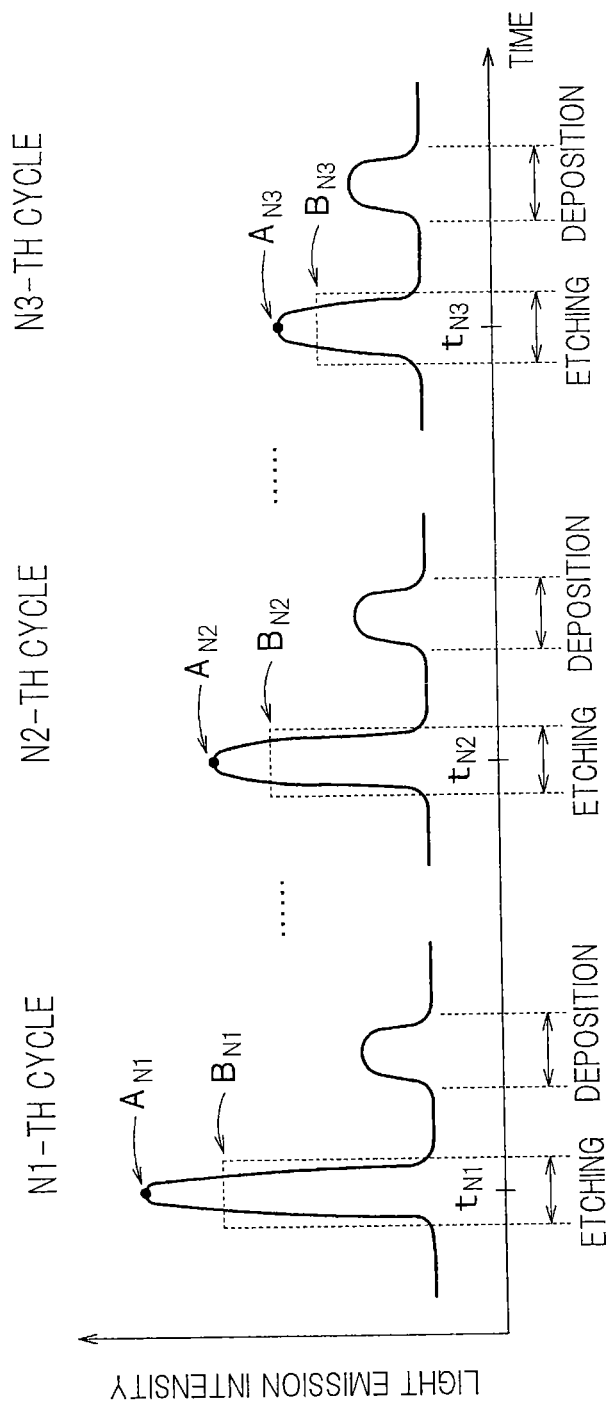

FIG. 6 presents peak values $A_{N1}$, $A_{N2}$ and $A_{N3}$ of the light emission intensities in the etching processes for the N1-th, N2-th and N3-th cycles. Times $t_{N1}$, $t_{N2}$ and $t_{N3}$ represent times when the light emission intensities reach the peak values $A_{N1}$, $A_{N2}$ and $A_{N3}$, respectively.

FIG. 6 further presents average values $B_{N1}$, $B_{N2}$ and $B_{N3}$ of the light emission intensities in the etching processes for the N1-th, N2-th and N3-th cycles. The average values $B_{N1}$, $B_{N2}$ and $B_{N3}$ represent time average values of the light emission intensities from the etching start (plasma generation start) to the etching end (plasma generation end) in the etching processes for the individual cycles.

An example of the performance time of an etching process of each cycle is approximately 7 seconds in the present embodiment. Moreover, an example of the performance time of a deposition process of each cycle is approximately 5 seconds in the present embodiment.

When the monitor PC 14 of the present embodiment extracts the light emission intensities in the etching processes for the individual cycles, the monitor PC 14 extracts the peak values or the average values of the light emission intensities. The extracted peak values or average values are transmitted from the monitor PC 14 to the main PC 15. The main PC 15 of the present embodiment then detects the etching end point of the cycle etching, based on the received peak values or average values as mentioned later.

Usage of the peak values for detecting the etching end point leads to an advantage, for example, that the peak values can be more simply extracted than the average values generally. Meanwhile, usage of the average values for detecting the etching end point leads to an advantage, for example, that the accurate light emission intensities can be extracted even in the case where the light emission intensities for the individual cycles do not elevate up to the saturated state. For example, in the case where the performance time of an etching process of each cycle is short, there is a possibility that the light emission intensities for the individual cycles do not elevate up to the saturated state.

Figure 7:
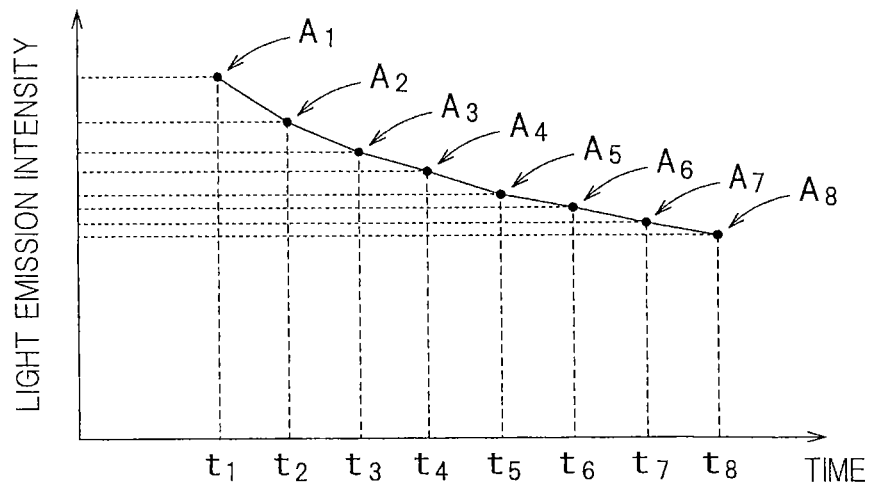

FIG. 7 presents peak values $A_1$ to $A_8$ of the light emission intensities in the etching processes for the first to eighth cycles. Times $t_1$ to $t_8$ represent times when the light emission intensities reach the peak values $A_1$ to $A_8$, respectively.

The main PC 15 of the present embodiment receives the peak values of the light emission intensities of the plural cycles such as the peak value $A_1$ of the first cycle, the peak value $A_2$ of the second cycle, . . . , and the peak value $A_N$ of the Nth cycle from the monitor PC 14, where N is an integer of two or more.

The main PC 15 of the present embodiment then displays a graph of these peak values on the screen of the main PC 15. FIG. 7 illustrates an example of this graph. In FIG. 7, the peak values $A_1$ to $A_8$ are plotted in time series, and lines connect the peak values $A_1$ to $A_8$. The user of the semiconductor manufacturing apparatus of the present embodiment can see the graph to confirm the change (decrease) of the light emission intensities in the etching processes during the cycle etching.

The main PC 15 of the present embodiment may create the graph using the average values of the light emission intensities.

Figure 8:
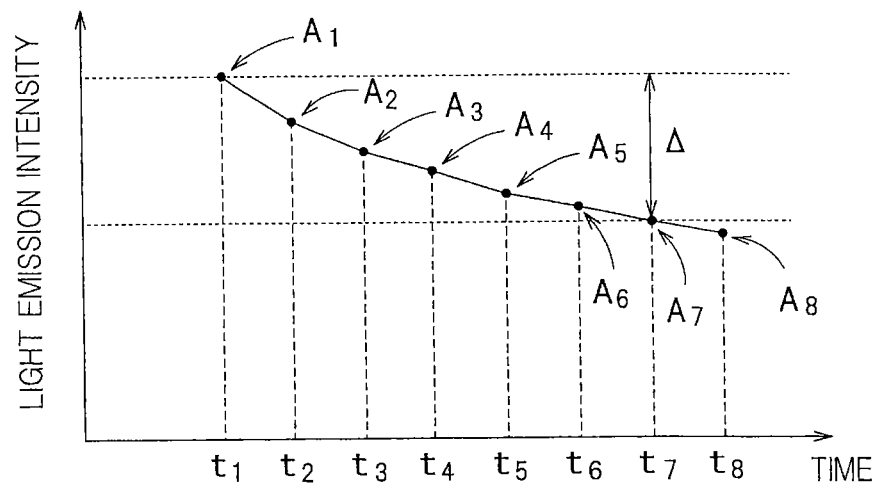

FIG. 8 is a graph for explaining a method of detecting the etching end point of the present embodiment.

The main PC 15 of the present embodiment detects the etching end point of the cycle etching, based on the light emission intensities of the plural cycles. Specifically, the main PC 15 of the present embodiment detects the etching end point, based on decrease amounts of the peak values of the light emission intensities for the individual cycles relative to the peak value of the light emission intensity for the first cycle (initial cycle). In other words, the main PC 15 of the present embodiment detects the etching end point based on the values of $A_1$-$A_2$, $A_1$-$A_3$, $A_1$-$A_4$ and the like. The first cycle is an example of a predetermined cycle.

Sign $\Delta$ represents a threshold of these decrease amounts. The threshold $\Delta$ of the present embodiment is a constant and preset in the main PC 15. The main PC 15 compares the decrease amounts of the peak values for the individual cycles with the threshold $\Delta$. When a decrease amount of a peak value for a certain cycle reaches the threshold $\Delta$, the main PC 15 determines that the cycle etching reaches the etching end point at this cycle. FIG. 8 illustrates that the decrease amount $A_1$-$A_7$ of the peak value $A_7$ for the seventh cycle reaches the threshold $\Delta$. In this way, the main PC 15 of the present embodiment can detect the etching end point.

When the etching end point is detected, the main PC 15 of the present embodiment automatically finishes the cycle etching by stopping the operation of the gas feeder 13 and the chamber 12. Alternatively, when the etching end point is detected, the main PC 15 of the present embodiment may display that the cycle etching reaches the etching end point on the screen. In this case, the user may finish the cycle etching manually.

The main PC 15 of the present embodiment may detect the etching end point, based on decrease ratios of the peak values for the individual cycles relative to the peak value for the first cycle. In other words, the main PC 15 of the present embodiment may detect the etching end point based on the values of $(A_1-A_2)/A_1$, $(A_1-A_3)/A_1$, $(A_1-A_4)/A_1$ and the like. In this case, the threshold $\Delta$ is replaced by a threshold of the decrease ratios.

Moreover, the main PC 15 of the present embodiment may detect the etching end point, based on the decrease amounts or the decrease ratios of the average values for the individual cycles relative to the average value for the first cycle. The method of detecting the etching end point in this case is similar to the case of using the peak values.

Furthermore, the main PC 15 of the present embodiment may adopt a cycle other than the first cycle as the predetermined cycle that is the reference of the comparison.

FIG. 9 is a flowchart illustrating the semiconductor manufacturing method of the first embodiment. FIG. 9 illustrates an example of a flow of the semiconductor manufacturing method described with reference to FIGS. 5 to 8.

First, the etching process of the first cycle is performed (step S1). In this stage, the monitor PC 14 monitors the light emission intensity in the etching process and transmits the monitoring result of the light emission intensity to the main PC 15 (step S2). An example of the monitoring result is the peak value or the average value of the light emission intensity. The main PC 15 then plots the peak value or the average value of the light emission intensity in the etching process for the first cycle in the graph (step S3). Next, step S4 is performed or omitted, and the deposition process of the first cycle is performed (step S5).

The second cycle is then performed, similarly to the first cycle. First, the etching process for the second cycle is performed (step S1). In this stage, the monitor PC 14 monitors the light emission intensity in the etching process, and transmits the monitoring result of the light emission intensity to the main PC 15 (step S2). The main PC 15 then plots the peak value or the average value of the light emission intensity in the etching process for the second cycle in the graph (step S3).

Next, the main PC 15 determines whether or not the light emission intensity for the second cycle reaches the predetermined light emission intensity (step S4). For example, the main PC 15 determines whether or not the decrease amount of the peak value of the light emission intensity for the second cycle reaches the threshold $\Delta$. When the decrease amount does not reach the threshold $\Delta$, the deposition process for the second cycle is performed (step S5). The processes in steps S1 to S5 are repeated until the decrease amount reaches the threshold $\Delta$.

On the other hand, when the decrease amount reaches the threshold $\Delta$, the main PC 15 determines that the cycle etching reaches the etching end point, and finishes the cycle etching.

As described above, the semiconductor manufacturing apparatus of the present embodiment extracts the light emission intensities in the etching processes for the individual cycles, and detects the etching end point of the cycle etching based on the extracted light emission intensities of the plural cycles.

For example, in a case where the light emission intensity in the cycle etching is measured without discriminating among the etching processes, the deposition processes and the breakthrough processes, the light emission intensity repeats drastic increase and decrease. In this case, the etching end point of the cycle etching is difficult to be detected based on this light emission intensity.

On the other hand, the semiconductor manufacturing apparatus of the present embodiment extracts the light emission intensities in the etching processes for the individual cycles out of the light emission intensity in the cycle etching. Therefore, in the present embodiment, the change (decrease) of the light emission intensity along with the progress of the cycle etching can be easily sensed as illustrated in FIGS. 7 and 8. Therefore, the present embodiment makes it possible, by detecting the etching end point based on the extracted light emission intensities of the plural cycles, to accurately detect the etching end point of the cycle etching.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
   extracting, in cycle etching that repeats first processes of etching a workpiece layer and second processes of performing different processing from the first processes for plural cycles, light emission intensities in the first processes for individual cycles; and
   detecting an etching end point of the workpiece layer in the cycle etching, based on the light emission intensities of the plural cycles, comprising,
   calculating decrease amounts of the light emission intensities for second to Nth cycles relative to the light emission intensity for a first cycle, where N is an integer of three or more, and
   determining that the cycle etching reaches the etching end point at the Nth cycle when the decrease amount of the light intensity for the (N−1)th cycle does not reach a threshold and the decease amount of the light intensity for the Nth cycle reaches the threshold.

2. The method of claim 1, wherein the etching end point is detected based on peak values of the light emission intensities for the individual cycles.

3. The method of claim 1, wherein the etching end point is detected based on average values of the light emission intensities for the individual cycles.

4. The method of claim 1, wherein
   the first process of a Kth cycle forms a Kth concave portion in the workpiece layer by lowering a bottom face of a (K−1)th concave portion that is formed in the workpiece layer in the first process of the (K−1)th cycles, where K is an integer of two or more, and
   the second process of the (K−1)th cycle forms a (K−1)th film on a side face of the (K−1)th concave portion, the (K−1)th film being used as a mask for an etching to lower the bottom face of the (K−1)th concave portion in the first process of the Kth cycle.

5. The method of claim 1, further comprising displaying values obtained from the light emission intensities on a screen.

6. The method of claim 1, wherein a second process includes a process of forming a film on the workpiece layer.

7. The method of claim 6, wherein a first process includes a process of etching the workpiece layer by using the film as a mask.

8. The method of claim 6, wherein the second process further includes a breakthrough process of the film.

* * * * *